United States Patent
Hajdu et al.

[19]

[11] Patent Number: 5,923,576

[45] Date of Patent: Jul. 13, 1999

[54] PARALLEL RECURSIVE DIGITAL FILTERS

[75] Inventors: Christopher Alan Hajdu; Darryl Ray Polk, both of Austin, Tex.

[73] Assignee: International Business Machines Corporation, Armonk, N.Y.

[21] Appl. No.: 08/205,812

[22] Filed: Mar. 3, 1994

Related U.S. Application Data

[63] Continuation of application No. 07/920,950, Jul. 28, 1992, abandoned.

[51] Int. Cl.$^6$ .................................................... G06F 17/10
[52] U.S. Cl. ........................................................ 364/724.17
[58] Field of Search ........................... 364/724.01, 724.1, 364/724.13, 724.17; 381/1, 17, 18, 63; 379/375

[56] References Cited

U.S. PATENT DOCUMENTS

| | | | |
|---|---|---|---|
| 4,117,541 | 9/1978 | Ali | 364/724 |
| 4,507,728 | 3/1985 | Sakamoto et al. | 379/375 |
| 4,777,612 | 10/1988 | Tomimitsu | 364/724.13 |
| 4,823,299 | 4/1989 | Chang et al. | 364/735 |
| 4,918,742 | 4/1990 | Simonds | 382/41 |
| 4,947,362 | 8/1990 | Bui | 364/724.19 |
| 5,075,880 | 12/1991 | Moses et al. | 364/724.1 |
| 5,091,951 | 2/1992 | Ida et al. | 381/63 |
| 5,216,718 | 6/1993 | Fukuda | 381/18 |

*Primary Examiner*—Chuong Dinh Ngo
*Attorney, Agent, or Firm*—Mark S. Walker; Keith Stephens

[57] ABSTRACT

This invention generally relates to improvements in digital audio processing and more particularly to digitally filtering stereo data in parallel to increase the quality of the audio information in an efficient manner.

10 Claims, 20 Drawing Sheets

FLOW CHART OF FILTER SOFTWARE PROCESSING.

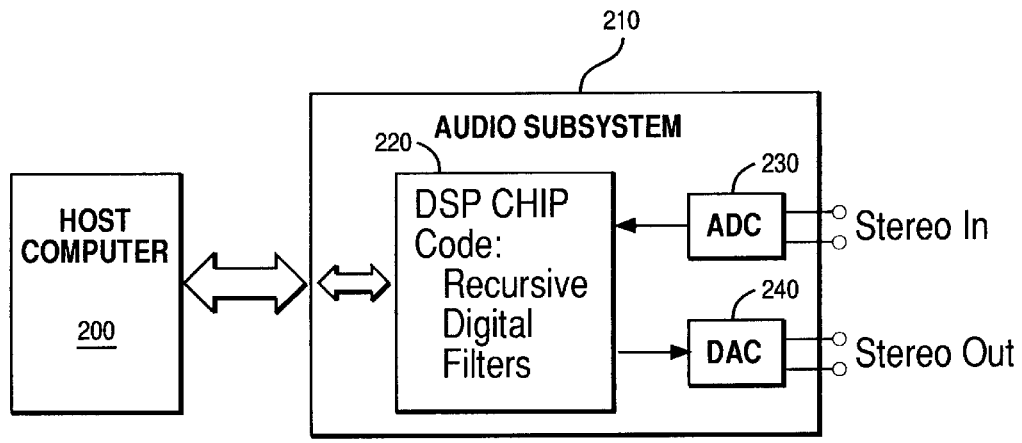
FIG. 2  DIGITAL AUDIO SYSTEM
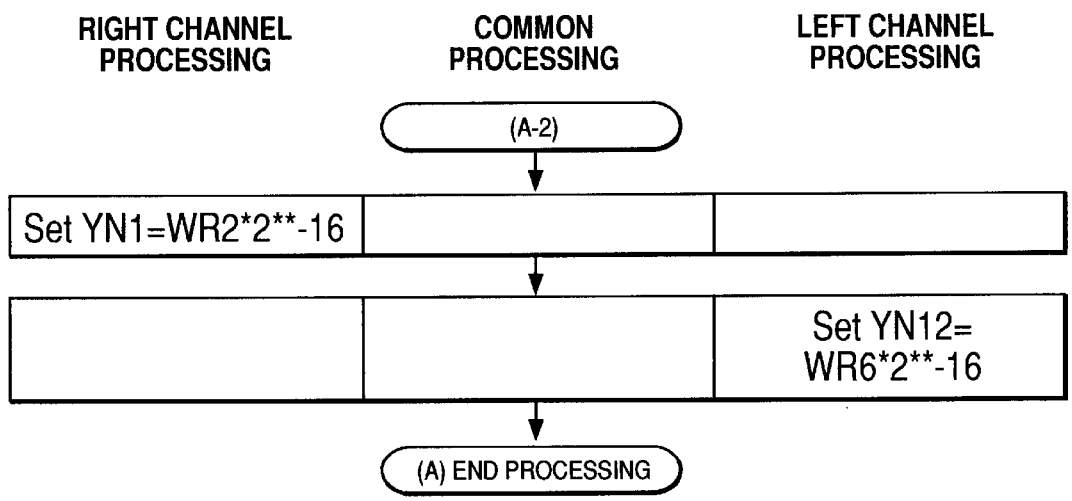
FIG. 7C (CONTINUED). FLOW CHART FOR PARALLEL PROCESSING FIRST POLE PAIR FOR LEFT AND RIGHT CHANNELS.

Equations:

Right Channel:

```
WR2 = GAIN1*XN0 + B2*YN2
YN2 = YN1
YN1 = (WR2 + 2*B1*YN1) *2*2**-16
WR2 = GAIN2*XN1 + B4*YN4
YN4 = YN3
YN3 = (WR2 + 2*B3*YN3) *2*2**-16
YN5 = (GAIN3*YN3 + B5*YN5) *2*2**-16
```

Left Channel:

```
WR6 = GAIN1*XN02 + B2*YN22
YN22 = YN12
YN12 = (WR6 + 2*B1*YN12) *2*2**-16
WR6 = GAIN2*YN12 + B4*YN42
YN42 = YN32
YN32 = (WR6 + 2*B3*YN32) *2*2**-16
YN52 = (GAIN3*YN32 + B5*YN52) *2*2**-16
```

Notes:
1. For each channel, filter consists of two complex poles and one single pole.
2. To minimize errors due to fixed point arithmetic, (16 bit) filter coefficients for both channels are scaled as follows: GAIN1, GAIN2, GAIN3, B2, B4, and B5 by 215 and B1 and B3 by 214.
3. Numerical values of coefficients for a specific sample frequency of 44100 Hz and cutoff frequency of 7000 Hz are:

| Coefficient | Unscaled | Scaled |
    | --- | --- | --- |
    | B1 | 0.7435 | 12182 |
    | B2 | -0.1991 | -6524 |
    | B3 | 0.8566 | 14035 |
    | B4 | -0.5399 | -17691 |
    | B5 | 0.3689 | 12088 |
    | GAIN1 | 0.4556 | 14929 |
    | GAIN2 | 0.6833 | 22390 |
    | GAIN3 | 0.6311 | 20680 |

4. Processing is done with saturation control on.

FIG. 3 DIGITAL FILTER EQUATIONS REQUIRED FOR PROCESSING TWO CHANNEL STEREO DATA.

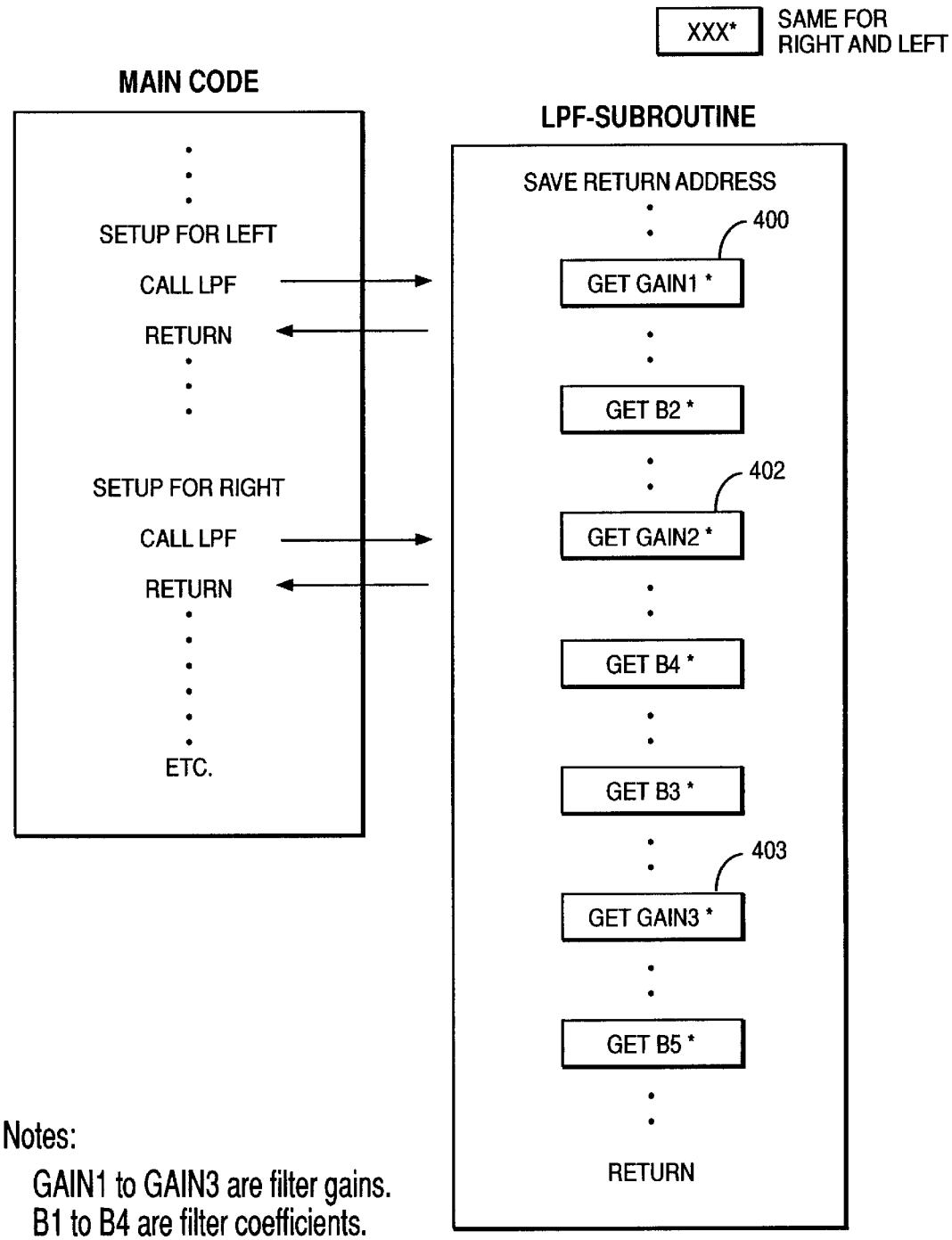
FIG. 4 CONVENTIONAL STRUCTURE FOR NON-PARALLEL PROCESSING RECURSIVE DIGITAL FILTERS.

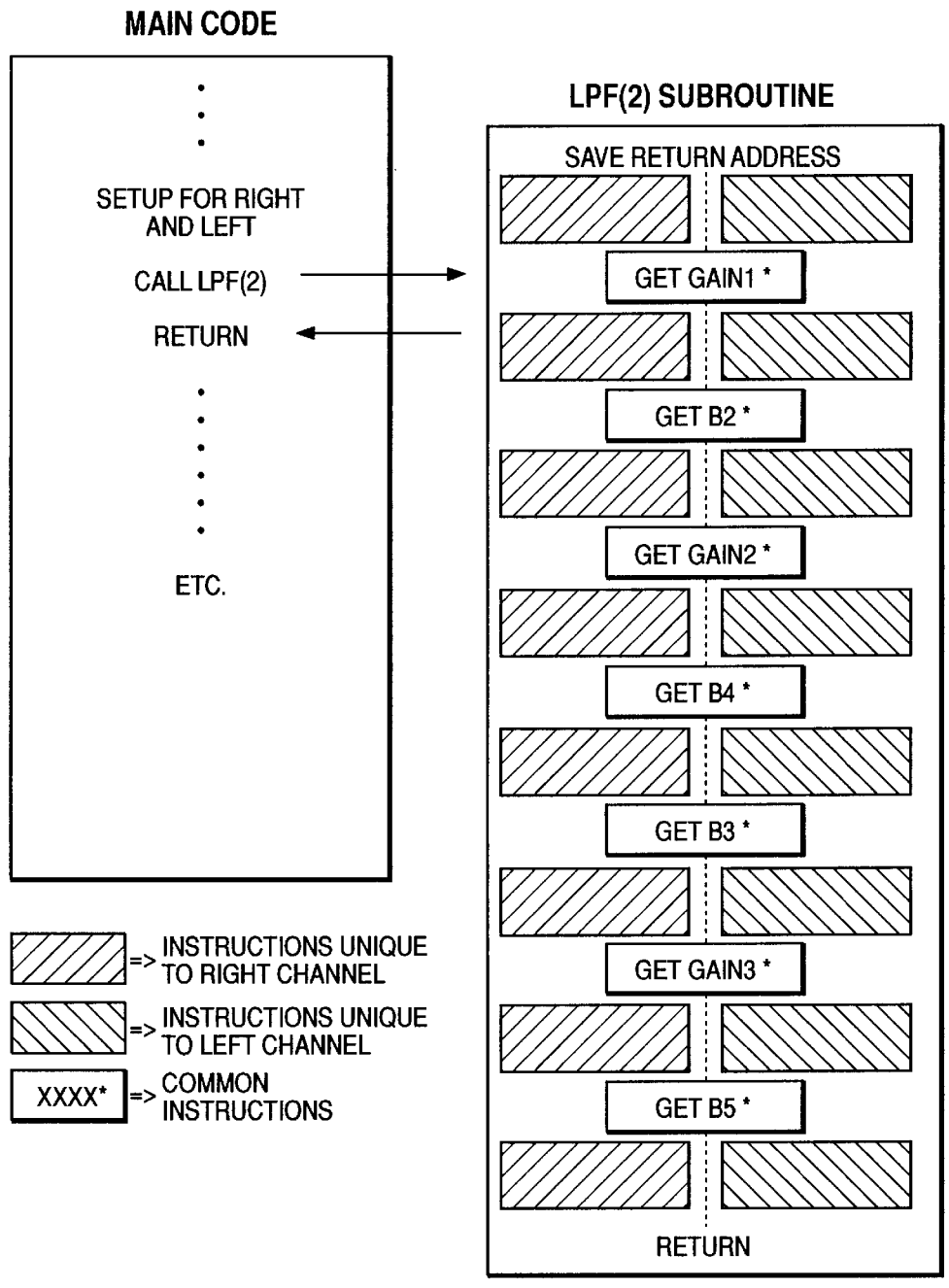
FIG. 5 PARALLEL STRUCTURE FOR PROCESSING RECURSIVE DIGITAL FILTERS.

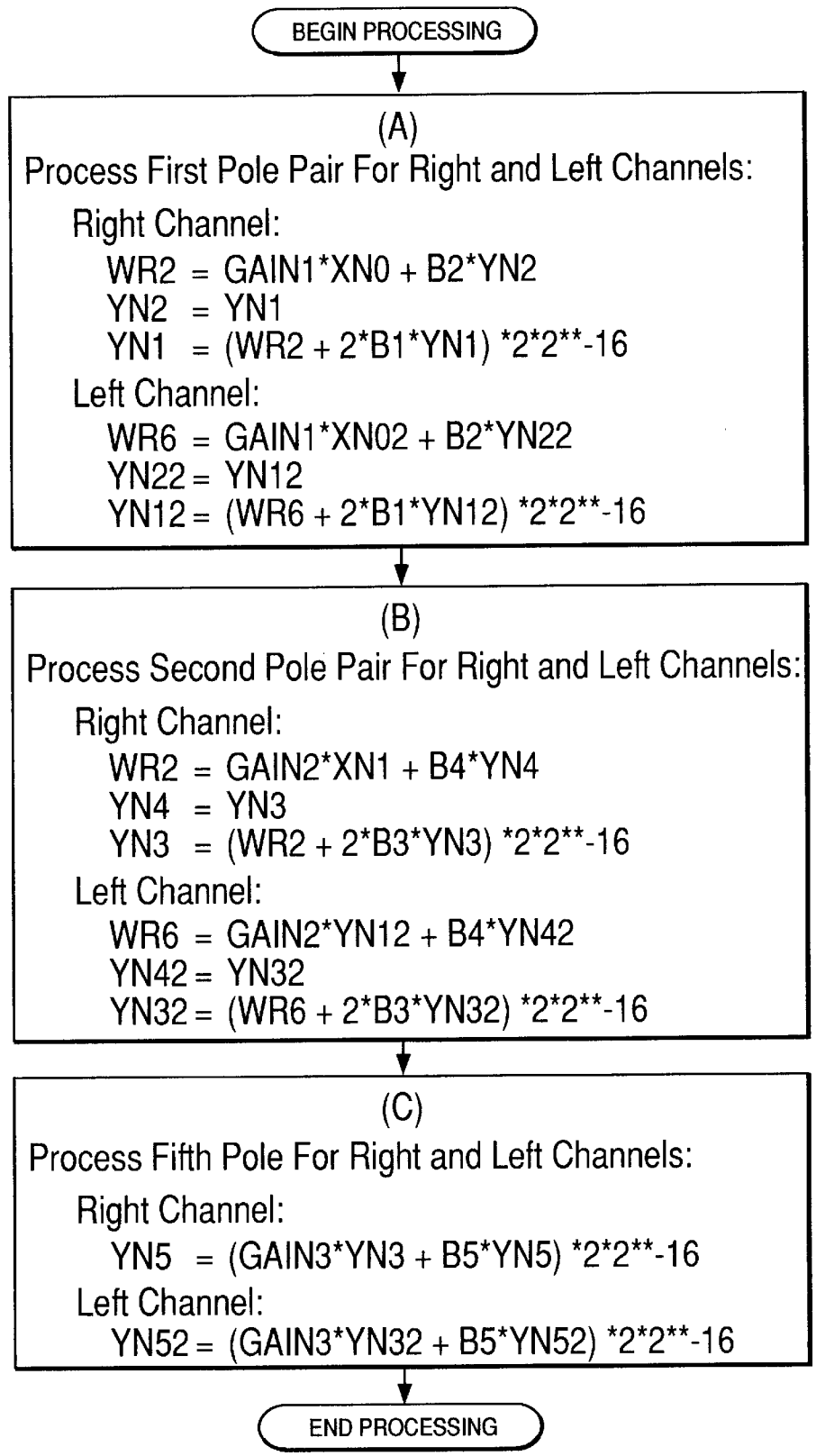
FIG. 6  FLOW CHART OF FILTER SOFTWARE PROCESSING.

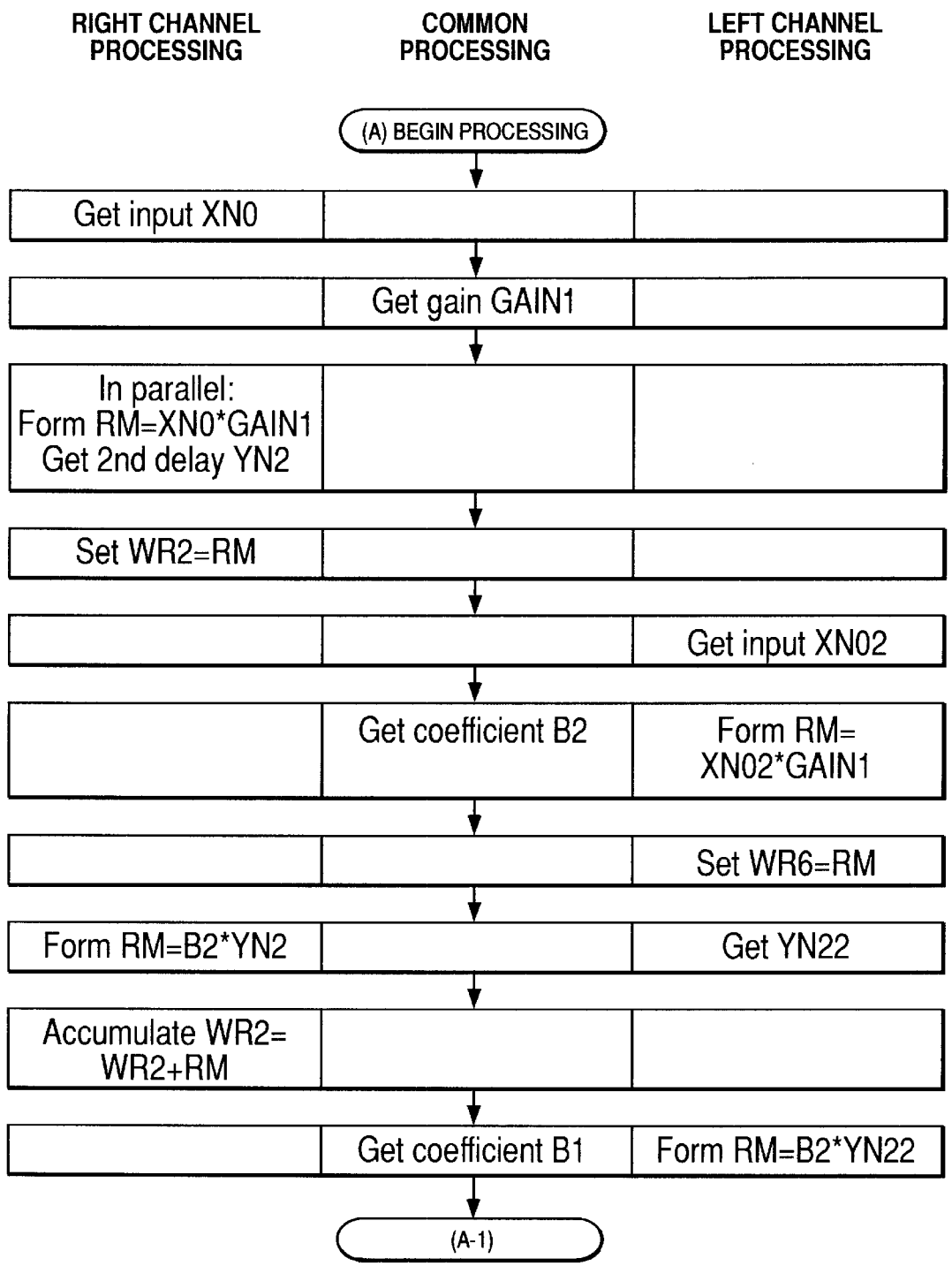
FIG. 7A  FLOW CHART FOR PARALLEL PROCESSING FIRST POLE PAIR FOR RIGHT AND LEFT CHANNELS.

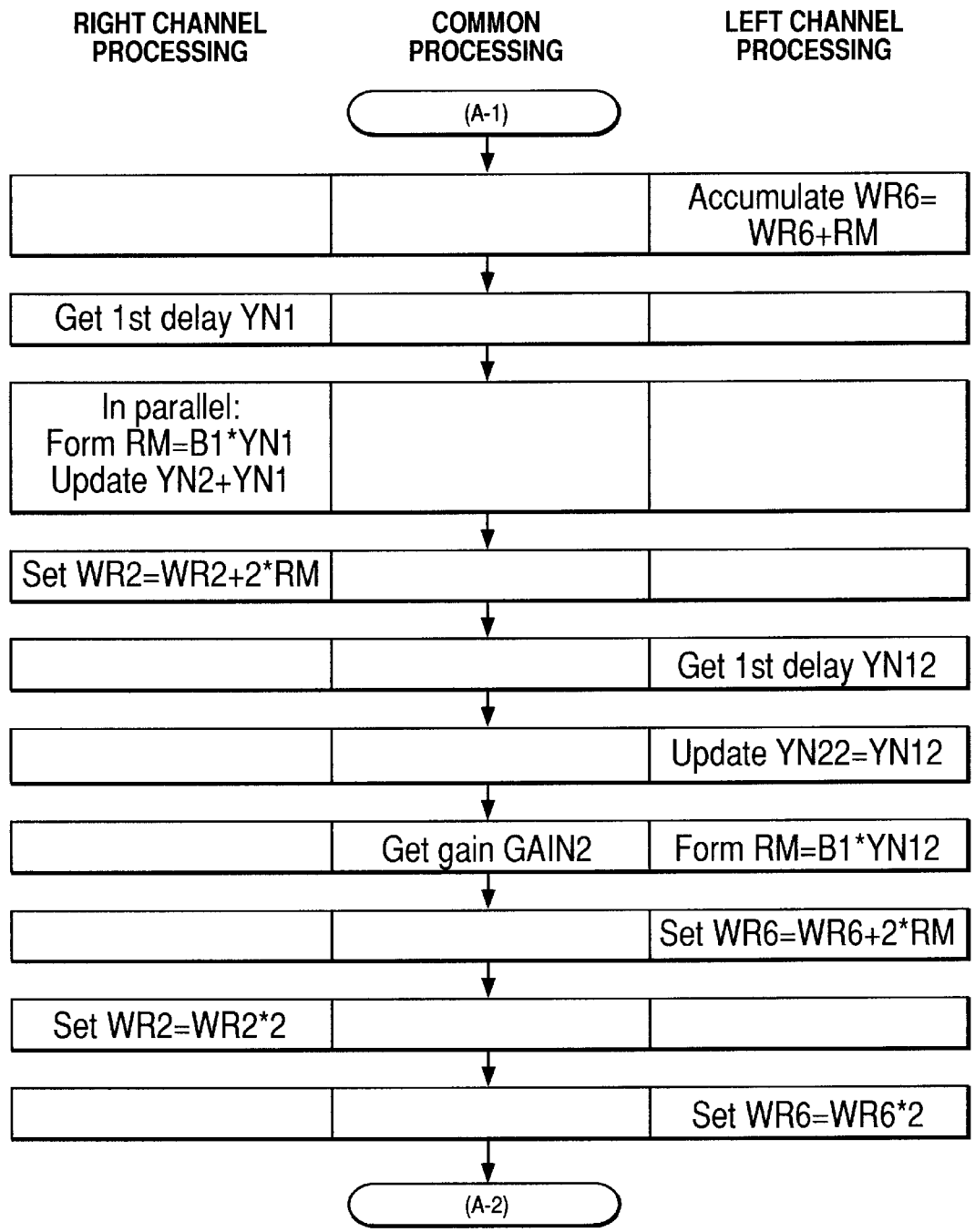
FIG. 7B (CONTINUED) FLOW CHART FOR PARALLEL PROCESSING FIRST POLE PAIR FOR LEFT AND RIGHT CHANNELS.

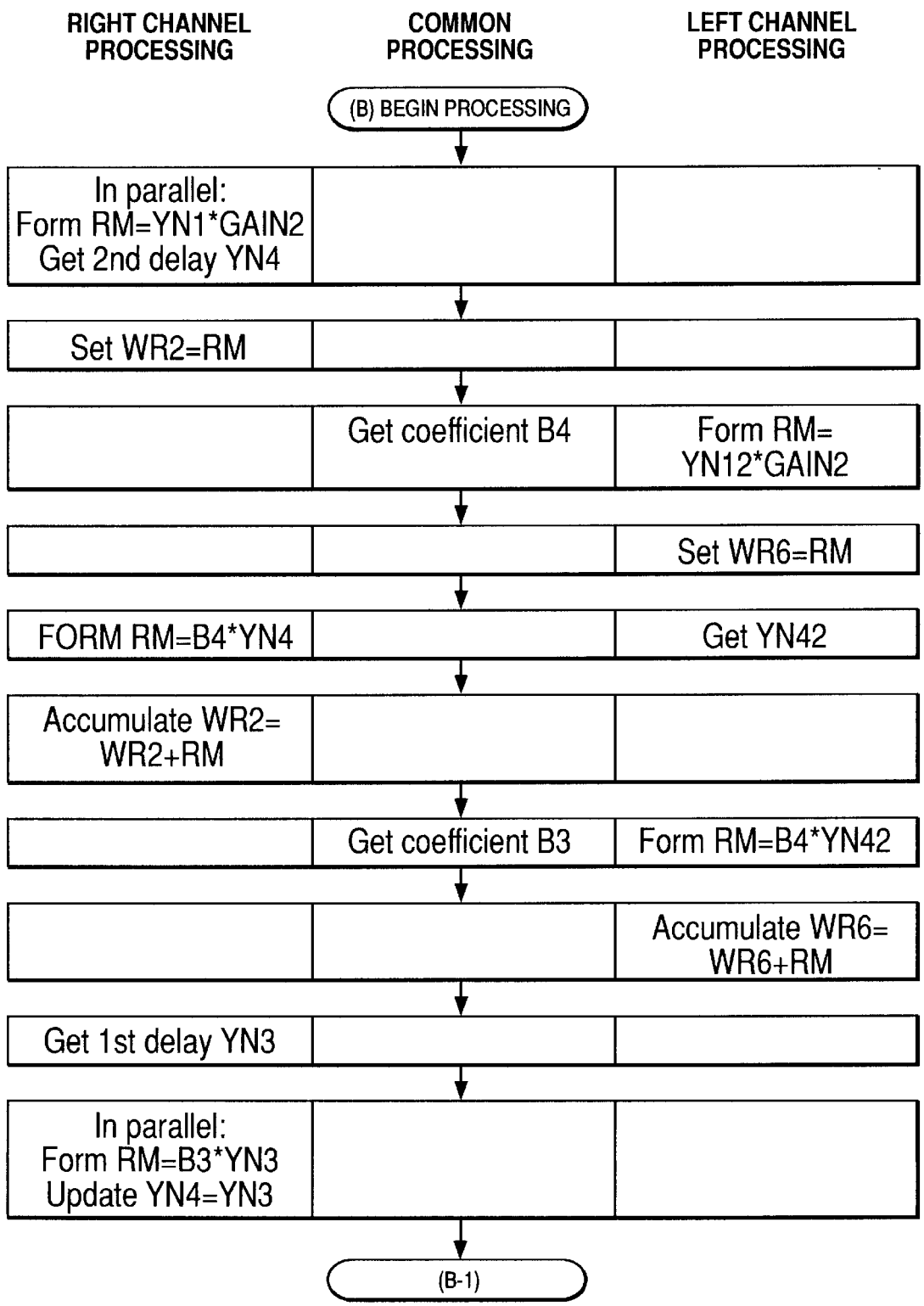
FIG. 8A FLOW CHART FOR PARALLEL PROCESSING SECOND POLE PAIR FOR RIGHT AND LEFT CHANNELS.

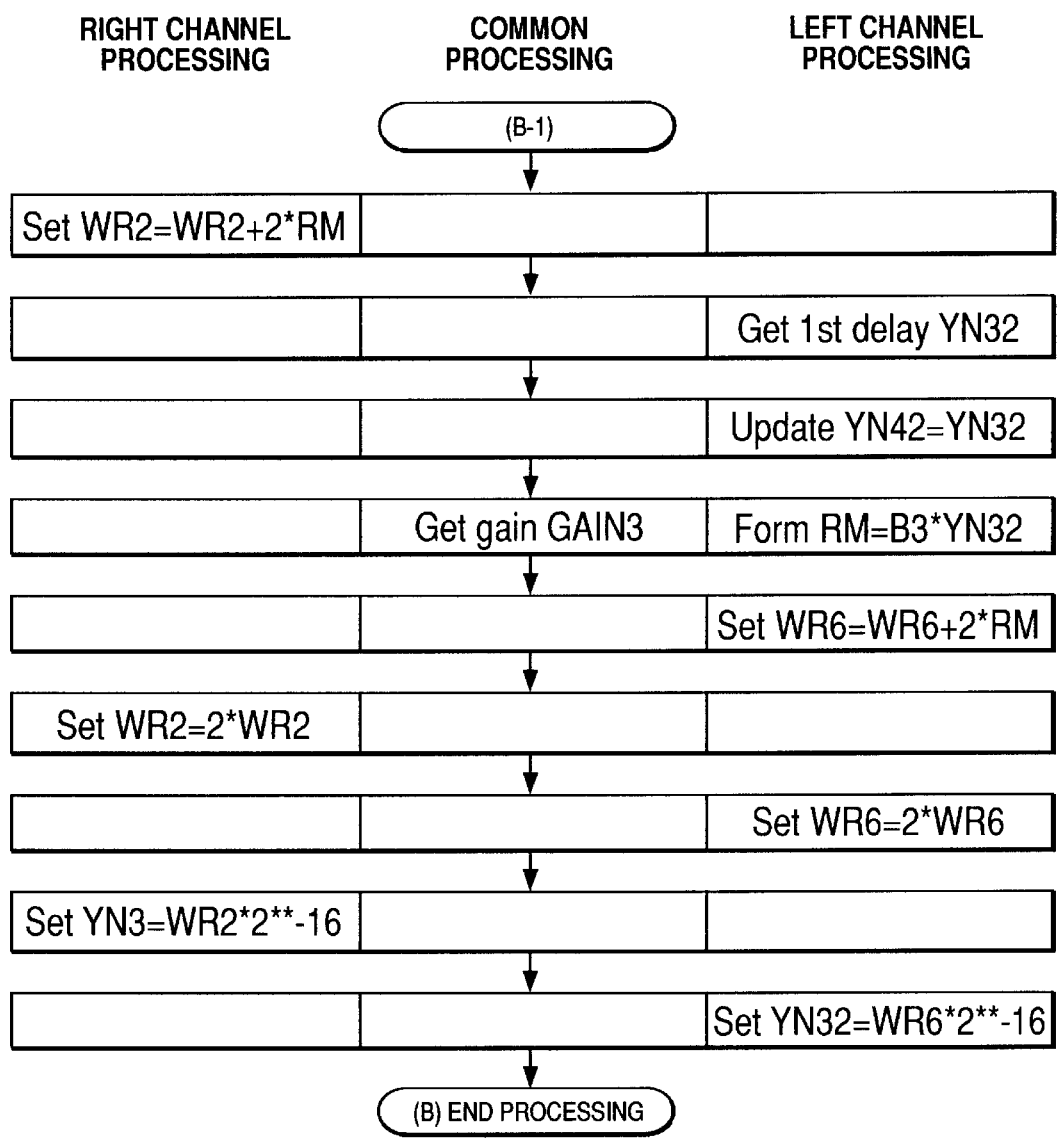
FIG. 8B (CONTINUED) FLOW CHART FOR PARALLEL PROCESSING SECOND POLE PAIR FOR LEFT AND RIGHT CHANNELS.

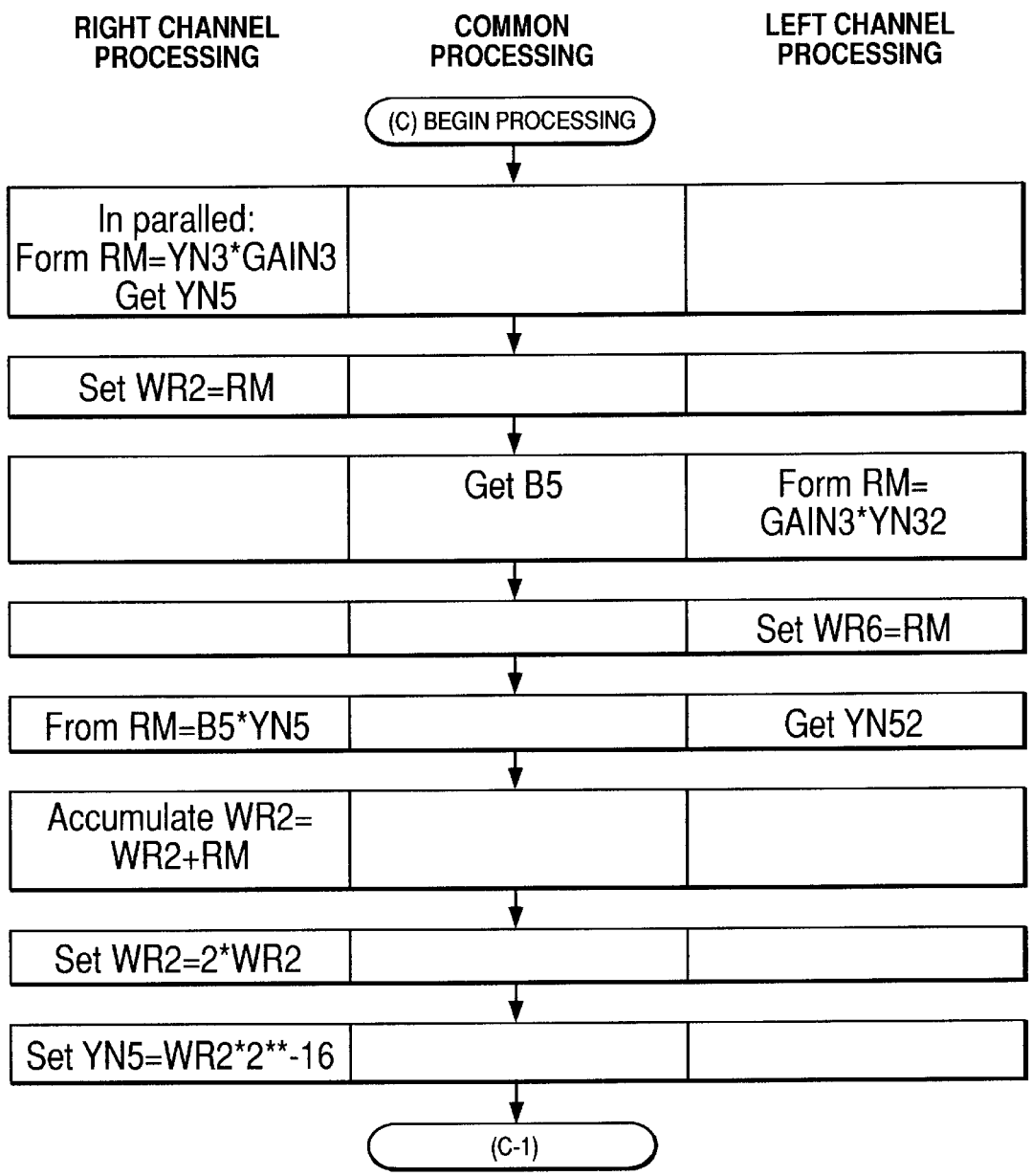
FIG. 9A   FLOW CHART FOR PARALLEL PROCESSING FIFTH POLE.

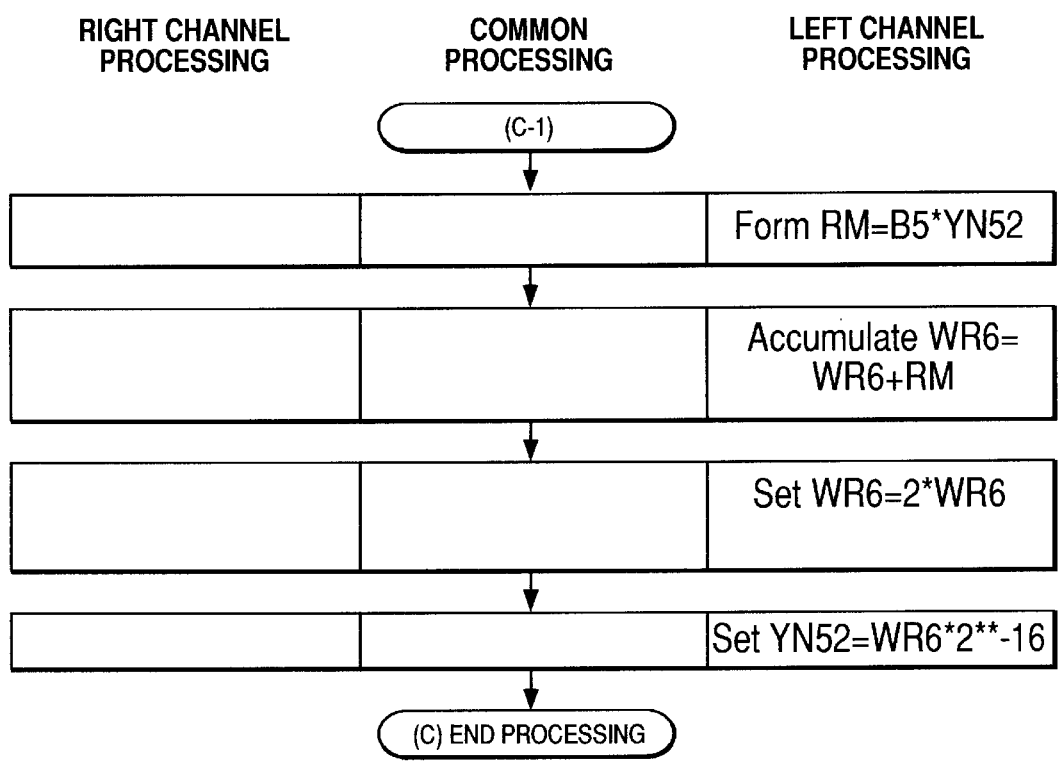
FIG. 9B (CONTINUED) FLOW CHART FOR PARALLEL PROCESSING FIFTH POLE.

```
R3=XN0(R0)
                        R5=GAIN1(R0)
R3*R5  R3=YN2(R0)
WR2=RM
                                              R1=XN02(R0)
                        R5=B2(R0)             R1*R5
                                              WR6=RM
R3*R5                                         R1=YN22(R0)
WR2=WR2+@RM
                        R5=B1(R0)             R1*R5
                                              WR6=WR6+@RM
R3=YN1(R0)
R3*R5  YN2(R0)=R3
WR2=WR2+@RM
WR2=WR2+@RM
                                              R1=YN12(R0)
                                              YN22(R0)=R1
                        R5=GAIN2(R0)          R1*R5
                                              WR6=WR6+@RM
                                              WR6=WR6+@RM

WR2=WR2+@WR2                                  WR6=WR6+@WR6

YN1(R0)=R2                                    YN12(R0)=R6

R3*R5  R3=YN4(R0)
WR2=RM
                        R5=B4(R0)             R6*R5
                                              WR6=RM
R3*R5                                         R1=YN42(R0)
WR2=WR2+@RM
                        R5=B3(R0)             R1*R5
                                              WR6=WR6+@RM
R3=YN3(R0)
R3*R5  YN4(R0)=R3
WR2=WR2+@RM
WR2=WR2+@RM
```

FIG. 10A    ISP SOURCE CODE FOR PARALLEL IMPLEMENTATION OF TWO CHANNEL STEREO DIGITAL FILTERS.

```
A                                                                                    A

R1=YN32(R0)
                                                          YN42(R0)=R1
                                    R5=GAIN3(R0)          R1*R5
                                                          WR6=WR6+@RM
                                                          WR6=WR6+@RM
WR2=WR2+@WR2

WR6=WR6+@WR6
YN3(R0)=R2
                                                          YN32(R0)=R6
R2*R5   R3=YN5(R0)
WR2=RM
                                    R5=B5(R0)             R6*R5
                                                          WR6=RM
R3*R5                                                     R1=YN52(R0)
WR2=WR2+@RM
WR2=WR2+@WR2
YN5(R0)=R2

R1*R5
                                                          WR6=WR6+@RM
                                                          WR6=WR6+@WR6
                                                          YN52(R0)=R6
```

FIG. 10B (CONTINUED)  ISP SOURCE CODE FOR PARALLEL IMPLEMENTATION OF TWO CHANNEL STEREO DIGITAL FILTERS.

Machine Control Register

THE MCRH REGISTER IS A 16-BIT REGISTER THAT
CONTROLS VARIOUS FUNCTIONS IN THE ISP PROCESSOR.

MCRH

| 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|
| 1 | 0 | 0 | 0 | R4TA | OVFA | SCS | M0S2 | M0S1 | M0S0 | MPM | PWSM | X | M4S2 | M4S1 | M4S0 |

MCRL

| 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|
| X | X | X | X | X | X | X | X | INT0 | INT1 | INT2 | INT3 | INT4 | INT5 | INT6 | INT7 |

FIG. 12

MCRH Register Bits Summary

| Bit | Name | Function |
|---|---|---|
| 0-2* | M4S0-M4S2 | Modulo addressing for register R4<br>000 Linear addressing<br>001 Modulo 32<br>010 Modulo 64<br>011 Modulo 128<br>100 Modulo 256<br>101 Modulo 512<br>110 Modulo 1024<br>111 Modulo 2048 |
| 3 | Reserved | Value is not defined. |
| 4 | PWSM | Product Word Scale Mode<br>0 Standard RP<br>1 Scaled RP |
| 5 | MPM | Medium Product mode<br>0 Standard RPM<br>1 Scaled RPM |
| 6-8* | M0S0-M0S2 | Modulo addressing for register R0<br>000 Linear addressing<br>001 Modulo 32<br>010 Modulo 64<br>011 Modulo 128<br>100 Modulo 256<br>101 Modulo 512<br>110 Modulo 1024<br>111 Modulo 2048 |
| 9 | SCS | Saturation control<br>0 Disable saturation<br>1 Enable saturation |

| Bit | Name | Function |
|---|---|---|
| 10 | OVFA | ALU overflow interrupt control.<br>0  Inhibit interrupt on ALU overflow<br>1  Enable interrupt on ALU overflow |
| 11 | R4TA | R4 table addressing.<br>0  Use contents of R4 as byte address<br>1  Use contents of R4 as word address |
| 12-15 | ALS | Architecture Level Select<br>0xxx  ISP 5.5<br>1000  ISP 5.6 |

Note: Bits marked with an asterick (*), affect the decode phase of the instruction pipeline. Therefore, changes to these bits do not affect the instruction immediately following the change.

FIG. 13B (CONTINUED)

| Bit | Name | Function | Read/Write |
|---|---|---|---|
| 8 | US | Unsigned product flag. Indicates how the present multiplier product contents should be interpreted.<br>1  Unsigned product<br>0  Signed product | R/W |
| 9 | Reserved | Value is not defined. | |
| 10 | ILRH | ILR lock hold hatch<br>1  ILR is locked<br>0  ILR is unlocked | R |

FIG. 15B (CONTINUED)

Process Status Register

PSRH

| X | X | X | X | ILRH | BS | US | AOI | PAOI | FBAC | TORC | AS | AV | AY | AZ |
|---|---|---|---|------|----|----|-----|------|------|------|----|----|----|----|

PSRL (Read Format)

| X | X | X | X | X | X | X | INT0 | INT1 | INT2 | INT3 | INT4 | INT5 | INT6 | INT7 |
|---|---|---|---|---|---|---|------|------|------|------|------|------|------|------|

PSRL (Write Format)

| CLR | FRC | TST | POWR | INT0 | INT1 | INT2 | INT3 | CLR | FRC | TST | PROR | INT4 | INT5 | INT6 | INT7 |
|-----|-----|-----|------|------|------|------|------|-----|-----|-----|------|------|------|------|------|
| ← Group 0 → | | | | | | | | ← Group 1 → | | | | | | | |

FIG. 14

PSRH Register Bits Summary

| Bit | Name | Function | Read/Write |
|---|---|---|---|
| 0 | AZ | ALU zero flag:<br>1    ALU result was all zeros<br>0    ALU result was non-zero | R/W |
| 1 | AY | ALU carry flag:<br>1    Carry out after last ALU operation<br>0    No carry out | R/W |
| 2 | AV | ALU overflow flag:<br>1    ALU overflow occurred<br>0    No overflow | R/W |
| 3 | AS | ALU sign flag:<br>1    ALU result was negative<br>0    ALU result was positive or zero | R/W |
| 3 | Reserved | Value is not defined. | |
| 4 | Reserved | Value is not defined. | R |
| 5 | FBAC | Foreground/background flag<br>1    Foreground mode<br>1    Background mode | R |
| 6 | PAOI | ALU overflow pending flag<br>1    ALU overflow is pending, and not yet serviced<br>0    No overflow pending | R/W |
| 7 | AOI | ALU overflow interrupt<br>1    ALU overflow has occurred<br>0    No overflow | R/W |

FIG. 15A

PARALLEL RECURSIVE DIGITAL FILTERS

This is a continuation of application Ser. No. 07/920,950 filed Jul. 28, 1992, now abandoned.

FIELD OF THE INVENTION

This invention generally relates to improvements in digital audio processing and more particularly to digitally filtering stereo data to increase the quality of the audio information in an efficient manner.

BACKGROUND OF THE INVENTION

Many patents disclose systems and methods for filtering image and audio information in an efficient manner. U.S. Pat. No. 4,918,742 to Simonds, and entitled, IMAGE PROCESSING USING MULTI-PASS CONVOLUTION WITH SMALL KERNELS, discloses an image processing system which uses a single processor to perform convolution on an image.

Another example of an imaging system is disclosed in U.S. Pat. No. 4,823,299 to Chang et al. The patent presents a real time system for processing the complex Kalman Filter algorithm. This algorithm is used in target tracking for radar signal processing and it has no known application to audio information.

A still further example of a signal processor is found in U.S. Pat. No. 4,947,362 to Bui. The patent discloses an adaptive digital filter for signal processing that is implemented on a VLSI chip. The adaptive filter has dual delay lines to yield a sequence of simultaneous samples of both input and output signals. The filter uses parallel logic for implementation of a least mean square adaptive filter.

Finally, in U.S. Pat. No. 4,117,541 to Ali, a configurable parallel arithmetic structure for recursive digital filtering is disclosed. The patent relates to time division multiplexed and frequency division multiplexed processing of digital data emulating a sixth-order elliptical digital filter.

None of the patents or other prior art references applicant is aware of suggests a method or system for parallel digital filters for recursively processing audio information.

SUMMARY OF THE INVENTION

Accordingly, it is a primary objective of the present invention to improve digital audio processing by filtering stereo data in parallel using recursive digital filters.

These and other objectives of the present invention are accomplished by the receipt of stereo audio information through the analog input ports of the audio subsystem. The audio information is digitized by the analog to digital converter (ADC) and transmitted to the Digital Signal Processor (DSP) data space. The data is filtered to provide anti-aliasing. The filtering processes stereo audio information in parallel with a resultant savings of machine cycles. The filtered stereo signal is then prepared to be compressed or undergo other transformations in the host.

To play back the audio signal, filtering is also required. A digitized audio signal from the host is passed through a parallel, recursive digital filter. The filtered digital signal is thereafter processed by a digital to analog converter (DAC) where it is converted to an analog signal and sent to an amplifier or other device for transmission to speakers or other audio devices.

BRIEF DESCRIPTION OF THE DRAWINGS

FIG. 2 is a block diagram of a digital audio system in accordance with the subject invention;

FIG. 3 is a digital filter equation for processing two channel stereo data in accordance with the subject invention;

FIG. 4 is a drawing of a conventional structure for non-parallel processing recursive filters in accordance with the subject invention;

FIG. 5 is a drawing of a parallel structure for processing recursive filters in accordance with the subject invention;

FIG. 6 is a flowchart of the filter logic in accordance with the subject invention;

FIGS. 7A–7C are flowcharts for parallel processing a first pole pair for right and left channels in accordance with the subject invention;

FIGS. 8A–8B are flowcharts for parallel processing a second pole pair for right and left channels in accordance with the subject invention;

FIGS. 9A–9B are flowcharts for parallel processing a fifth pole in accordance with the subject invention;

FIG. 10 is ISP source code for parallel implementation of two channel stereo digital filters in accordance with the subject invention;

FIG. 12 is a block diagram of the ISP machine register architecture in accordance with the subject invention;

FIG. 13 is a block diagram of the ISP register bits in accordance with the subject invention;

FIG. 14 is a block diagram of the ISP process status register in accordance with the subject invention; and FIG. 15 is a block diagram of the ISP process status register bits in accordance with the subject invention.

DETAILED DESCRIPTION OF THE INVENTION

Figure 1:
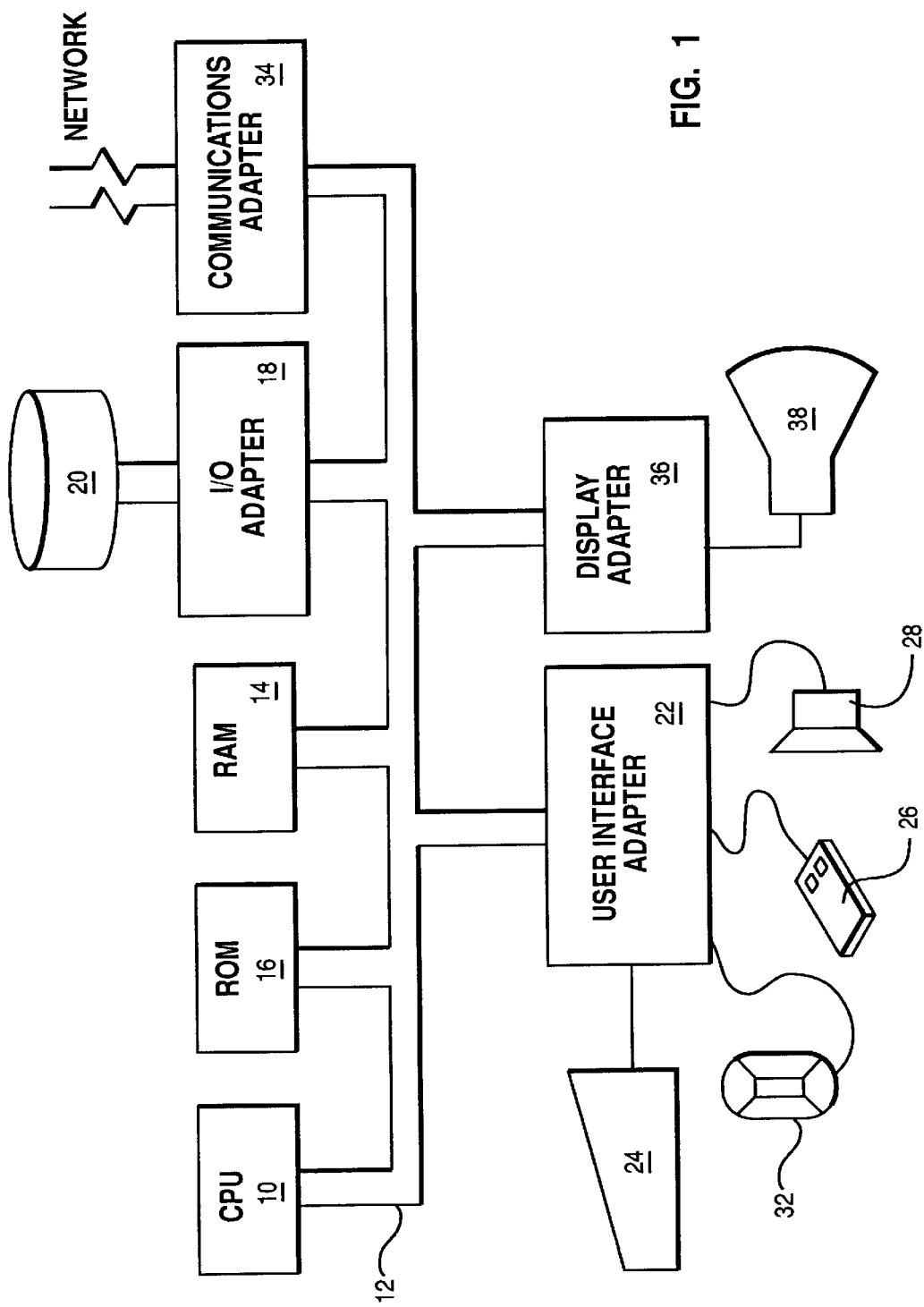
FIG. 1 is a block diagram of a host computer in accordance with the subject invention.
Figure 11:
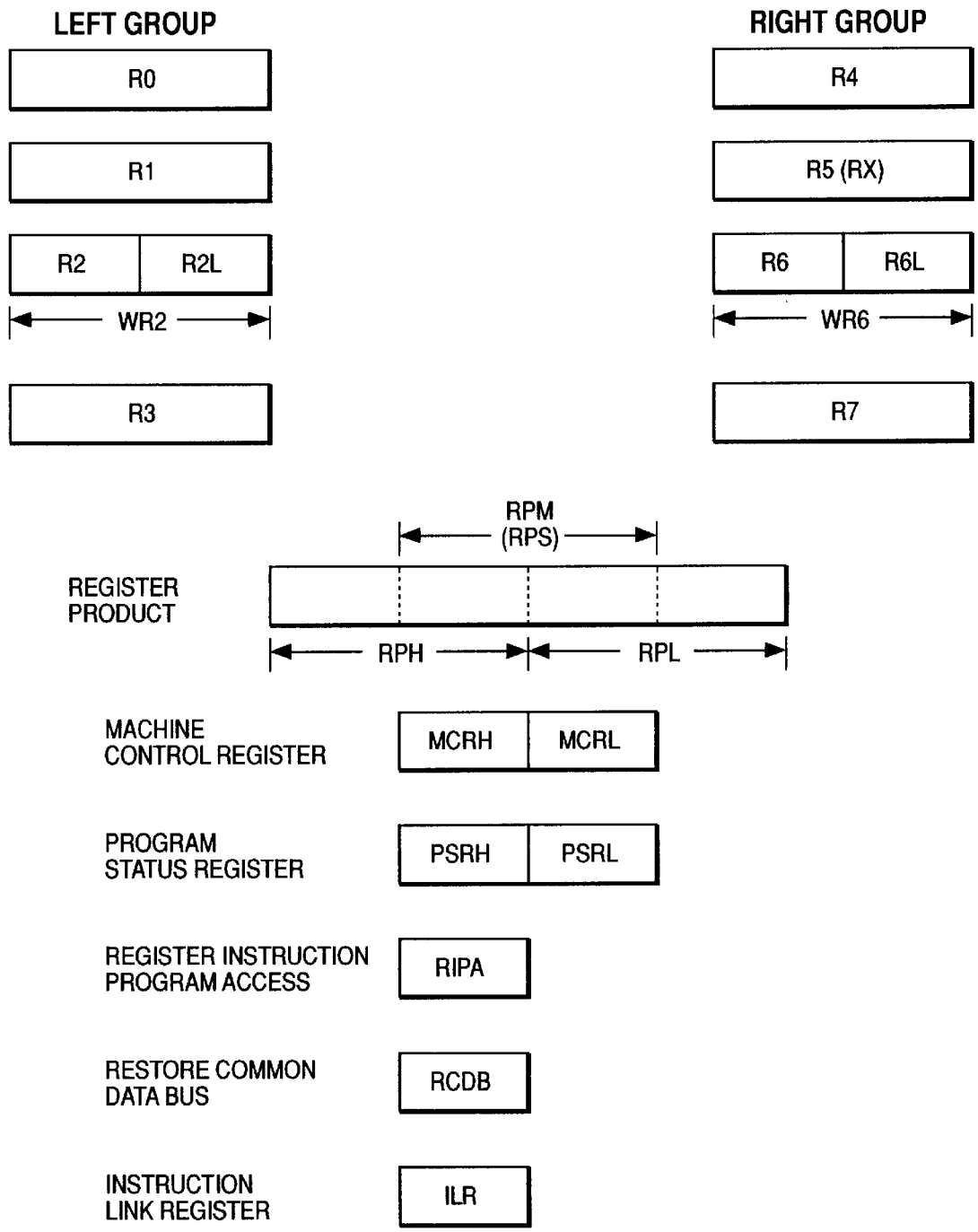
FIG. 11 is a block diagram of the ISP register architecture in accordance with the subject invention.

A representative hardware environment is depicted in FIG. 1, which illustrates a typical hardware configuration of a computer in accordance with the subject invention having a central processing unit 10, such as a conventional microprocessor, and a number of other units interconnected via a system bus 12. The computer shown in FIG. 1 includes a Random Access Memory (RAM) 14, Read Only Memory (ROM) 16, an I/O adapter 18 for connecting peripheral devices such as disk units 20 to the bus, a user interface adapter 22 for connecting a keyboard 24, a mouse 26, a speaker 28, a microphone 32, and/or other user interface devices such as a touch screen device (not shown) to the bus, a communication adapter 34 for connecting the computer to a data processing network and a display adapter 36 for connecting the bus to a display device 38.

FIG. 2 is a block diagram of an audio system in accordance with the subject invention. The host computer is as described in FIG. 1. The audio subsystem 210 is attached to the bus of the host computer and includes a Digital Signal Processor (DSP) 220 to implement the recursive digital filters in accordance with the subject invention. Stereo data enters the computer at the analog to digital converter (ADC) 230 and is transmitted via the digital to analog converter (DAC) 240 to speakers or other audio device.

When recording or playing back digital audio data, recursive digital filters are used to remove unwanted noise effects and to smooth the data. Implementation of these filters is facilitated with a digital signal processor (DSP) 220 such as a Texas Instruments TMS320 DSP.

If stereo sound is involved, separate filters are used for each of the channels. Even though the filter characteristics of each channel, including bandwidth and sample rate, are usually the same, separate filters are employed because the states of each filter channel differ.

The mathematical equations which constitute a five pole recursive digital filter for right and left channel stereo processing are shown in FIG. 3. The conventional structure for non-parallel processing of these filters is shown functionally in FIG. 4. Note, the filter gains GAIN1 400, GAIN2 402 and GAIN3 403 and coefficients B1 to B5 for each channel are loaded separately even though the numerical values for each channel are the same. This redundant loading of gains and coefficients uses machine cycles inefficiently. Even though the particular example uses five pole filters, the implementation process holds independent of filter size. Inefficiency increases with the size of the filter.

The IBM Digital Signal Processor (ISP) provides parallel processing capability that are employed by the invention to significantly reduce processing time. A detailed description of the ISP is presented below. The structure for parallel processing two, five pole recursive digital filters is shown in FIG. 5. The filter gains and coefficients for both channels are loaded only once. This processing reduces the number of loads required and permits some of the unique instructions to be executed at the same time due to the parallel processing features of the ISP.

FIGS. 6 through 9 present the parallel nature of the processing structure in accordance with the subject invention. Processing is divided into three sections:

(1) RIGHT for processing those instructions unique to the right channel,
(2) LEFT for processing those instructions unique to the left channel, and
(3) COMMON for processing those instructions common to both channels.

Throughout the structure, multiple instructions appear on the same line. Instructions occurring on the same line get processed during the same cycle. This processing reduces the overall number of cycles required. Arranging the filters in this manner affords an opportunity to exploit the ISP's parallel processing capability.

FIG. 10 presents the ISP source code for parallel processing two channel stereo data employing two, five pole digital filters. This structure reduces filter processing requirements by over thirty percent.

IBM Signal Processor (ISP) Hardware Architecture

The IBM Signal Processor (ISP) is a digital signal processor that operates at sixteen million instructions per second (MIPS). The ISP has a Harvard architecture with data address space completely separate from instruction address space.

The ISP can address up to 64K instructions and up to 32K data words. Instructions are 24 bits wide and data words are 16 bits wide. Instructions pass through a three-phase pipeline: (1) Fetch, (2) Decode, and (3) Execute. The Arithmetic Logic Unit (ALU) is separate from the multiplier, so an ALU operation and a multiply can occur simultaneously in a single machine cycle.

Instructions can be classified into two categories: (1) Simplex instructions, and (2) Parallel instructions. A simplex instruction performs a single operation, such as a load from memory, during a machine cycle. The operations within a parallel instruction are encoded as a single 24-bit instruction.

ISP General Purpose Registers

The ISP contains eight general purpose 16-bit registers, R0–R7. Registers R2 and R6 have 16-bit extensions that enable usage in certain 32-bit operations. R0 and R4 can be used as index registers to form base-displacement addresses for load, store, store immediate and most branch instructions. R0 and R4 can also perform modulo or circular addressing. Modulo addressing is controlled by bit settings in the machine control register. R4 can perform table addressing, but R0 cannot. Register R5 (also called RX) is always one of the data sources in a multiplication. R1, R3 and R7 have no special properties. R7 is traditionally used to store a return address for subroutine calls.

The general purpose registers are arranged in two banks: R0–R3 and R4–R7. In a compound instruction that includes a load or load immediate instruction, the target of the transfer and the target of the ALU operation must come from opposite register banks. The ISP can multiply two 16-bit numbers in a single machine cycle. The product is stored in the 32-bit multiplier product (RP) register. RP can be used to perform 32-bit accumulations to WR2 or WR6. The low bits of the product can be accessed as register RPL, and the high order 16-bits as RPH.

The machine control register is divided into two 16-bit registers, MCRH and MCRL. ISP programs use MCRH extensively to control modulo addressing, arithmetic saturation and multiplier scaling. The eight low-order bits in MCRL are used to enable or inhibit interrupt levels 0–7. The Instruction Link Register (ILR) is normally equal to the location counter. It is also used to save the location counter after an interrupt and to perform position-relative branches. The Common Data Bus (CDB) is used implicitly by all data transfer operations. The CDB generally holds the last value loaded or stored. The CDB is explicitly referenced for the following reasons:

some branch instructions take the new contents of the location counter from the CDB; and
a test and branch can be performed on a specified bit in the CDB.

The processor status register consists of two 16-bit registers, PSRH and PSRL. PSRH is normally accessed explicitly only during interrupt processing. PSRH is frequently accessed implicitly, since it contains the condition codes or flags for the ISP chip. The PSRL register should not be accessed by an ISP programmer. The indirect program access register (RIPA) is used when loading data from the instruction address space with the BIPAR instruction.

ISP addressing is a word addressable architecture. Sixteen bits are always read from memory and only even addresses are accessible. Indexed addressing is facilitated using the R0 and R4 index registers. The contents of a register is combined with an eight bit or sixteen bit offset. Offset limits exist depending on whether simple or parallel instructions are used. Circular addressing is also enabled through modulo N addressing using the R0 and R4 registers. However, a buffer must be aligned and sized in powers of two. Table addressing is also facilitated using the R4 register.

ISP Instruction Processing

Instructions in the ISP pass through a three phase pipeline. Phase 1 is a fetch operation. Phase 2 is a decode operation. Phase 3 is an execute operation. During each machine cycle, three actions are occurring simultaneously. An instruction is being fetched from instruction memory. The previously fetched instruction is decoded, including the resolution of operands and addresses. The previously decoded instruction is executed. The net effect is that the instruction throughput is one instruction per machine cycle. Most instructions execute at the end of phase 3. However, branch instructions execute at the end of phase 2 with no additional hardware action during phase 3. The instruction immediately after a branch instruction is being fetched during the same phase that the branch is decoded and executed. The instruction immediately after a branch is always executed.

While the invention has been described in terms of a preferred embodiment in a specific system environment, those skilled in the art recognize that the invention can be practiced, with modification, in other and different hardware and software environments within the spirit and scope of the appended claims.

Having thus described our invention, what we claim as new, and desire to secure by Letters Patent is:

1. An apparatus for recursively filtering in parallel digital audio information, comprising:

(a) means for receiving digital audio information, having a first set of digital signals for a first channel and a second set of digital signals for a second channel;

(b) means for receiving filter coefficients;

(c) means for recursively filtering the audio information connected to said means for receiving digital audio information and said means for receiving filter coefficients, said means for recursively filtering including means for mathematically applying said coefficients to said first and second sets of digital signals in parallel with said means for receiving filter coefficients; and (d) means for storing the filtered audio information.

2. Apparatus as recited in claim 1, including means for scaling filter coefficients to minimize errors due to fixed point arithmetic, said means for scaling being connected between said means for receiving filter coefficients and said means for recursively filtering.

3. An apparatus for filtering digital audio information having two or more channels of digital signals, said apparatus comprising:

instruction execution means for processing filtering instructions;

data access means for accessing said digital audio information;

one multiplication and one logic processing means connected to said instruction execution means and said data access means for processing said digital audio information in accordance with said instruction execution means, said processing means overlapping instruction processing for said two or more channels of digital signals.

4. The apparatus of claim 3, further comprising:

second data access means for accessing filter coefficients, said second data access means being connected to said processing means.

5. The apparatus of claim 3, further comprising:

register means for storing intermediate results produced by and accessible to said processing means.

6. The apparatus of claim 5, further comprising:

transmission means connected to said processing means for transmitting said filtered digital audio information.

7. A method of applying a set of filter coefficients to two or more sets of digital signals to produce two or more corresponding sets of filtered digital signals, the method comprising the steps of:

loading one or more filter coefficients and one or more digital signals into a processor means having a multiplier and arithmetic logic unit;

multiplying two values selected from said filter coefficients, said digital signals or an intermediate result in said processor means while in the same processor cycle loading another filter coefficient or digital signal into said processor means; and repeating the steps of loading and multiplying until said filter coefficients have been applied to all digital signals in said two or more sets.

8. The method of claim 7, wherein said loading step loads values into registers in said processing means.

9. The method of claim 7, wherein the filter coefficients are selected to cause the multiplication to apply a five pole digital filter to the one or more digital signals.

10. The method of claim 8, wherein said two or more sets of digital signals are digital audio signals.

* * * * *